(12) United States Patent
Lee et al.

(10) Patent No.: US 9,209,108 B2
(45) Date of Patent: Dec. 8, 2015

(54) METHOD FOR FORMING A FINE PATTERN USING ISOTROPIC ETCHING

(71) Applicant: LG INNOTEK CO., LTD., Seoul (KR)

(72) Inventors: Sang-Yu Lee, Gumi (KR); Jee-Heum Paik, Daegu (KR); Soo-Hong Kim, Gumi (KR); Chang-Woo Yoo, Seoul (KR); Sung-Woon Yoon, Busan (KR)

(73) Assignee: LG INNOTEK CO., LTD., Seoul (KR)

( * ) Notice: Subject to any disclaimer, the term of this patent is extended or adjusted under 35 U.S.C. 154(b) by 40 days.

(21) Appl. No.: 13/917,207

(22) Filed: Jun. 13, 2013

(65) Prior Publication Data

US 2013/0299964 A1 Nov. 14, 2013

Related U.S. Application Data

(63) Continuation of application No. 12/442,607, filed as application No. PCT/KR2007/004592 on Sep. 20, 2007, now Pat. No. 8,486,838.

(30) Foreign Application Priority Data

Sep. 30, 2006 (KR) ........................ 10-2006-0096735

(51) Int. Cl.
*H01L 23/48* (2006.01)
*H01L 21/311* (2006.01)
(Continued)

(52) U.S. Cl.
CPC .......... *H01L 23/48* (2013.01); *H01L 21/31111* (2013.01); *H01L 21/31144* (2013.01);
(Continued)

(58) Field of Classification Search
CPC ..... H01L 23/48; H01L 23/481; H01L 23/482; H01L 23/485

USPC .......................................................... 257/734
See application file for complete search history.

(56) References Cited

U.S. PATENT DOCUMENTS

| | | | |
|---|---|---|---|
| 4,487,653 A | 12/1984 | Hatcher | |
| 4,717,681 A | 1/1988 | Curran | |

(Continued)

FOREIGN PATENT DOCUMENTS

| | | | |
|---|---|---|---|
| JP | 55-013964 A | 1/1980 | |
| JP | 62-048025 A | 3/1987 | |

(Continued)

OTHER PUBLICATIONS

USPTO NFOA mailed Apr. 11, 2011 in connection with U.S. Appl. No. 12/442,607.

(Continued)

*Primary Examiner* — Peniel M Gumedzoe
(74) *Attorney, Agent, or Firm* — Ladas & Parry LLP

(57) ABSTRACT

A method for forming a fine pattern using isotropic etching, includes the steps of forming an etching layer on a semiconductor substrate, and coating a photoresist layer on the etching layer, performing a lithography process with respect to the etching layer coated with the photoresist layer, and performing a first isotropic etching process with respect to the etching layer including a photoresist pattern formed through the lithography process, depositing a passivation layer on the etching layer including the photoresist pattern, and performing a second isotropic etching process with respect to the passivation layer. The second isotropic etching process is directly performed without removing the predetermined portion of the passivation layer.

10 Claims, 5 Drawing Sheets

(51) Int. Cl.
*H01L 21/3213* (2006.01)
*H05K 3/06* (2006.01)

(52) U.S. Cl.
CPC ............ *H01L21/32134* (2013.01); *H05K 3/06* (2013.01); *H05K 3/064* (2013.01); *H01L 2924/0002* (2013.01); *H05K 2203/0597* (2013.01); *H05K 2203/1476* (2013.01)

(56) References Cited

U.S. PATENT DOCUMENTS

| | | | |
|---|---|---|---|
| 6,075,269 | A | 6/2000 | Terasawa et al. |
| 6,235,638 | B1 | 5/2001 | Huang et al. |
| 6,472,329 | B1 | 10/2002 | Goto et al. |
| 6,583,063 | B1 | 6/2003 | Khan et al. |
| 2004/0232555 | A1* | 11/2004 | Komatsubara ................ 257/758 |
| 2005/0016961 | A1* | 1/2005 | Toda et al. ...................... 216/83 |
| 2005/0103749 | A1 | 5/2005 | Puech et al. |
| 2005/0284502 | A1 | 12/2005 | Watanabe et al. |
| 2006/0214191 | A1* | 9/2006 | Nishimura .................... 257/208 |
| 2007/0284738 | A1* | 12/2007 | Shimoishizaka et al. ..... 257/737 |

FOREIGN PATENT DOCUMENTS

| | | |
|---|---|---|
| JP | 02-218127 A | 8/1990 |
| JP | 03-024285 A | 2/1991 |
| JP | 04-096327 A | 3/1992 |
| JP | 2004-266230 A | 9/2004 |
| JP | 2006-351866 A | 12/2006 |
| KR | 1020020012750 A | 2/2002 |
| WO | 2004/093176 A1 | 10/2004 |

OTHER PUBLICATIONS

USPTO FOA mailed Dec. 16, 2011 in connection with U.S. Appl. No. 12/442,607.
USPTO NFOA dated Oct. 3, 2012 in connection with U.S. Appl. No. 12/442,607.
USPTO NOA mailed Mar. 14, 2013 in connection with U.S. Appl. No. 12/442,607.
International Search Report mailed Dec. 28, 2007; PCT/KR2007/004592.
Chinese State Intellectual Property Office Decision on Rejection; Appln No. 200780036512.1; Date of Issue: Jan. 10, 2011.

* cited by examiner

METHOD FOR FORMING A FINE PATTERN USING ISOTROPIC ETCHING

TECHNICAL FIELD

The present invention relates to a method for forming a fine pattern, and more particularly to a method for forming a fine pattern by using isotropic etching, capable of sufficiently ensuring the width of a fine pattern in a semiconductor integrated circuit and increasing the bonding strength between the semiconductor integrated circuit and a lead.

In detail, the present invention provides a method for forming a fine pattern using isotropic etching, in which isotropic etching is performed by depositing a protection material layer, thereby forming a fine pattern that cannot be realized through a typical isotropic etching scheme. Accordingly, a lead top width can be sufficiently ensured, thereby obtaining superior resolution and a focus margin. In addition, the shape of a lead is changed to have an increased sectional area so that heat emitted from a semiconductor integrated chip is more quickly dissipated and the lead can be easily bonded with the semiconductor integrated chip. Thus, the lead is applicable for various industrial fields, such as a tape carrier package that is a substrate for a semiconductor integrated circuit, a chip-on film, and a flexible circuit substrate.

BACKGROUND ART

In a manufacturing process of a semiconductor integrated circuit, an etching process refers to a process for selectively removing a layer formed on a substrate through an oxidation process or a thin film deposition process. In addition, the etching process is used to remove a selected portion of a wafer surface, and is performed after a photolithography process in a semiconductor process. In detail, according to the etching process, a photoresist (PR) pattern that is formed through the photolithography process is used as a mask, a portion under the mask and a portion exposed to an exterior are subject to different chemical reactions, and an unnecessary portion is removed from the wafer surface by using gas, acid, or alkali chemical materials, thereby forming a fine circuit pattern. Such a pattern forming procedure is repeatedly performed relative to each pattern layer.

The photolithography process is classified into an optical lithography technology and a radiation lithography technology. The optical lithography technology employs an ultraviolet (UV) beam, and the radiation lithography technology employs an x-ray beam, an electron beam, or an ionization beam. Photoresist patterns formed by the photolithography process are used as masks, and a portion under the mask and a portion exposed to an exterior are subject to different chemical reactions, so that a portion that is not protected by the mask is etched away during the photolithography process.

Through the above etching process, diffusion and ion implantation areas are determined, and a metallization process is performed. The etching process is divided into a wet etching process and a dry etching process according to schemes of removing an oxide layer. The wet etching process is most widely used in the semiconductor process. In other words, the etching process is used in the surface polishing of a cut wafer, wafer cleaning before the growing of a thermal oxidation layer or an epitaxial silicide layer (ESL), and the manufacturing of a semiconductor device having a line width of at least 3 µm.

Although the wet etching process can provide superior selectivity by using an etching solution having selectivity, the wet etching process causes an undercut phenomenon due to isotropic properties, so that the wet etching process is not suitable when it is necessary to form a fine pattern.

The undercut phenomenon is caused because the etching solution flows into the lower portion of a mask to form an oxidation pattern in the wet etching process.

FIG. 1 is a view showing a pattern that is isotropically etched according to the related art, and FIGS. 2 to 5 are views showing etched profiles according to the conventional isotropic over etching.

It can be recognized from FIG. 1 that the sectional surface of a fine pattern is shown in the shape of a trapezoid after performing the isotropic etching. This is because an etching solution is infiltrated into the lower portion of a photoresist pattern 110 to continuously etch the upper portion of a layer to be etched (hereinafter, referred to as an "etching layer") through the etching process, so that the etching layer has a gradually narrowed width in the upper portion thereof to be in the shape of a trapezoid. Such an etching process is continuously performed while etching the etching layer in the round shape until the surface of the semiconductor substrate 130 is exposed. As the above round shape is expanded, undercut below the photoresist layer becomes more severe. The formation range of the undercut cannot be detected until the photoresist layer is removed.

Referring to FIGS. 2 to 5, the shape of the edges of an oxide layer pattern represents the degree of undercut, and an etched profile is shown in FIGS. 2 to 5 as the etching process is performed. The etched fine pattern 120 formed on the photoresist pattern 110 and the semiconductor substrate 130 has different edge shapes according to the degree of an inclined plane. Color bands are created according to the thickness of an oxide layer on the etched incline plane, and the degree of undercut may be recognized by using the width of a black band created on the circumference of the oxide layer pattern. FIG. 6 is a photographic view showing the shape of a lead of a fine pattern employing isotropic etching according to the related art. Referring to FIG. 6, if isotropic etching is performed such that the height of the internal lead becomes 7.5 µm on an assumption that the pitch width (not shown) of an internal lead becomes 25 µm on a chip-on-film employing isotropic etching according to the related art, undercut occurs by the length of 4.9 µm in the upper portion of the internal lead and the length of 12.75 µm in the lower portion of the internal lead. Accordingly, the width of the upper portion of the internal lead is excessively narrowed, so that the fine pattern has the shape of a trapezoid.

As described above, according to the conventional isotropic etching scheme, since undercut is caused, a pattern cannot be realized in the case of a flexible printed circuit (FPC), a tape carrier package (TCP), and a chip on film (COF) requiring the fine pattern having a lead top width of at least 6 µm. In addition, since the sectional surface of the fine pattern has a trapezoid shape or a triangular shape, the bonding between the fine pattern and a semiconductor integrated circuit is difficult.

DISCLOSURE

Technical Problem

The present invention has been made to solve the above-mentioned problem occurring in the prior art, and an object of the present invention is to provide an isotropic etching scheme capable of ensuring a lead top width for a fine pattern and improving the bonding strength with a semiconductor integrated circuit.

Technical Solution

In order to accomplish of the object of the present invention, there is provided a method for forming a fine pattern using isotropic etching, including the steps of (1) forming an etching layer on a semiconductor substrate, and coating a photoresist layer on the etching layer, (2) performing a lithography process with respect to the etching layer coated with the photoresist layer, and performing a first isotropic etching process with respect to the etching layer including a photoresist pattern formed through the lithography process, (3) depositing a passivation layer on the etching layer including the photoresist pattern, and (4) performing a second isotropic etching process with respect to the passivation layer.

The method further includes the step of removing the passivation layer corresponding to a predetermined portion that is subject to the first isotropic etching process after step (3), wherein, in step (4), the second isotropic etching process is performed with respect to a portion in which the passivation layer is removed.

In addition, the semiconductor substrate includes a polyimide film.

Further, in step (2), the first isotropic etching process is performed until 10% to 50% of a thickness of the etching layer is etched from a top surface of the etching layer making contact with the photoresist layer.

The etching layer is one of a metal layer, an insulating layer, and a conductive layer.

The predetermined portion that is subject to the first isotropic etching process is a portion corresponding to a width of a trench formed in the photoresist pattern.

In addition, the photoresist layer is a chemically amplified photoresist layer. Further, the photoresist has a thickness in the range of 1 to 4 μm.

Advantageous Effects

As described above, according to the present invention isotropic etching is performed by depositing a protection material layer, thereby forming a fine pattern that cannot be realized through a typical isotropic etching scheme. Accordingly, a lead top width can be sufficiently ensured, thereby obtaining superior resolution and a focus margin. In addition, the shape of a lead is changed to have an increased sectional area so that heat emitted from a semiconductor integrated chip is more quickly dissipated and the lead can be easily bonded with the semiconductor integrated chip. Thus, the lead is applicable for various industrial fields, such as a tape carrier package that is a substrate for a semiconductor integrated circuit, a chip-on film, and a flexible circuit substrate.

BEST MODE

According to a preferred embodiment of the present invention, there is provided a method for forming a fine pattern using isotropic etching, including the steps of (1) forming an etching layer on a semiconductor substrate, and coating a photoresist layer on the etching layer, (2) performing a lithography process with respect to the etching layer coated with the photoresist layer, and performing a first isotropic etching process with respect to the etching layer including a photoresist pattern formed through the lithography process, (3) depositing a passivation layer on the etching layer including the photoresist pattern, and (4) performing a second isotropic etching process with respect to the passivation layer.

In particular, the method further includes the step of removing the passivation layer corresponding to a predetermined portion that is subject to the first isotropic etching process between step (3) and step (4). In this case, in step (4), the second isotropic etching process is performed with respect to a portion in which the passivation layer is removed.

Preferably, the semiconductor substrate includes a polyimide film.

More preferably, in step (2), the first isotropic etching process is performed until 10% to 50% of a thickness of the etching layer is etched from a top surface of the etching layer making contact with the photoresist layer.

When the etching layer is formed on the semiconductor substrate, the etching layer is preferably one of a metal layer, an insulating layer, and a conductive layer.

Further, the predetermined portion that is preferably subject to the first isotropic etching process is a portion corresponding to a width of a trench formed in the photoresist pattern.

In addition, preferably, the photoresist layer is a chemically amplified photoresist layer, and has a thickness in the range of 1 to 4 μm.

MODE FOR INVENTION

Hereinafter, an embodiment of the present invention will be described according to accompanying drawings.

Figure 7:
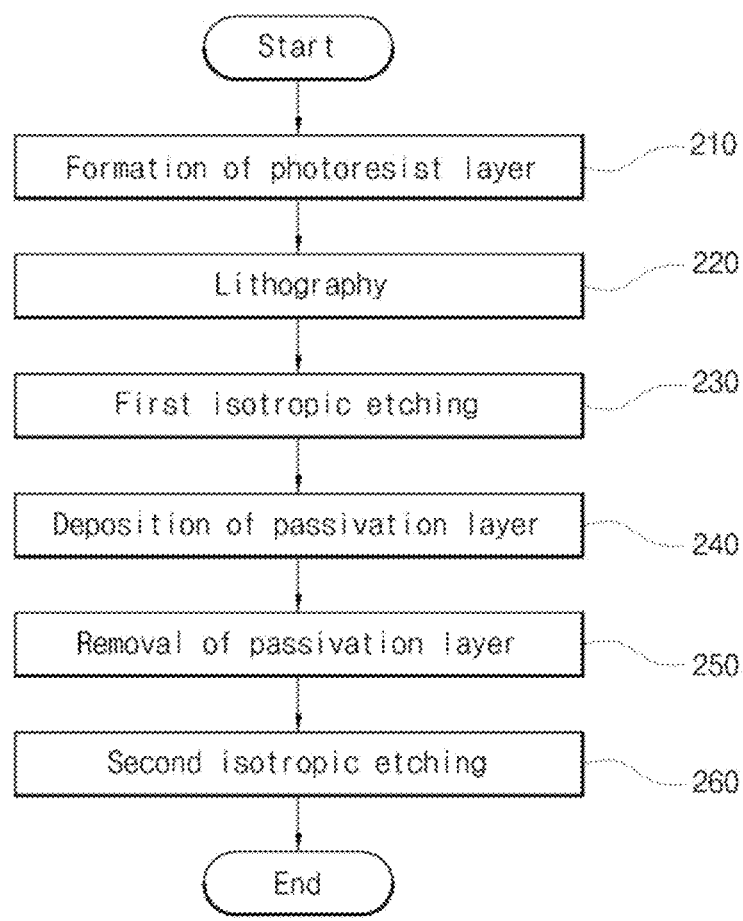
FIG. 7 is a flowchart showing a method for forming a fine pattern using isotropic etching according to the present invention.

FIG. 7 is a flowchart showing a method for forming a fine pattern employing isotropic etching according to the present invention.

After forming an etching layer, a photoresist layer is formed on an etching layer (step 210). If a scheme of forming the photoresist layer on the etching layer is generally known in the art, the scheme does not specially limit the scheme of forming the photoresist layer. For example, the scheme of forming the photoresist layer is a spin coating scheme, a laminating coating scheme, a deeping coating scheme, or a bar coating scheme.

Preferably, the photoresist layer may be a chemically amplified photoresist. The chemically amplified photoresist includes a photoacid generator (PAG) and acid-labile polymer/compound as main components. The photoacid generator includes organic sulfonic ester or onium salt. The organic sulfonic ester or the onium salt is photodecomposed so that strong acid such as an organic sulfonic acid is generated. The generated strong acid reacts with the acid-labile polymer as a catalyst to commence a chain reaction, so that numerous chemical bonds are created and numerous decomposition reactions occur. A chemically amplified photoresist is made by mixing a binary system of acid-labile polymer and photoacid generator (PAG) or a ternary system of acid-labile compound, photoacid generator (PAG), and matrix resin with control agent or additive used to improve the characteristics of a photoresist. The photoacid generator (PAG) is a photoresist component including a weight ratio in the range of 2% to 5% of a solid component. In the chemically amplified photoresist, acid-labile polymer/compound does not directly react through photolithography process, and acid is generated from the photoacid generator (PAG) of an exposed portion, thereby forming only a latent image. The generated acid acts as a catalyst for acid-labile material through the next post-exposure baking (PEB) process to amplify a chemical reaction and bring a remarkable solubility difference. In other words, through the photolithography process, the acid catalyst is distributed three dimensionally on a photoresist layer to form a latent image, and acid catalyst occurs by heat in the post-exposure baking process of a temperature of about 100° C. to bring a great solubility change in an exposed portion and an non-exposed portion of the photoresist layer, thereby greatly improving photo-sensitivity.

More preferably, the photoresist layer may be formed with the thickness in the range of 1 to 4 μm. If the thickness of the photoresist layer is 1 μm or less, the photoresist layer is insufficiently coated on the etching layer, so that the uniformity of a process is not ensured. If the thickness of the photoresist layer is 4 μm or more, a difference may occur in the thickness of the photoresist layer in the manufacturing process.

A lithography process is performed with respect to the etching layer coated with the photoresist layer (Step 220). The lithography process includes an exposure process and a development process. The exposure process is to transfer the shape of a fine pattern formed on the photomask into the coated photoresist by irradiation of UV light through the photomask. The light source includes light sources generally known in the art, and the present invention does not specially limit the light source.

The developing process is performed to melt a portion of a photoresist having weak bond with the substrate through the exposure process by using a solvent. Accordingly, a photoresist pattern is formed through the developing process. In the case of positive photoresist, polymer chains that are more weakly bonded are melted through the developing process. Developer solutions are mainly classified into alkaline solutions and solvent-based solutions. In general, although alkaline solutions such as a potassium hydroxide (KOH) solution are used as the developer solutions, acetone or specific solvent-based solutions may be used for negative photoresist such as strontium unit series (SU series).

Although it is not described as a process of the present invention, soft baking is performed in order to volatilize an organic material of the photoresist and improve the adhesion of the photoresist. In detail, the soft baking is performed after the developing process to harden the polymer tissue that has been released through the developing process. Such a baking process is frequently carried out in the photolithography process, and is mainly divided into soft baking after PR coating and PEB after light exposure.

After the soft baking is performed, a portion of the photoresist corresponding to an upper metal interconnection is exposed and developed, and then hard baking is performed in order to remove the organic material in contact with the developer solution and improve chemical resistance and endurance of the photoresist, thereby forming a photoresist pattern.

The first isotropic etching is performed with respect to the semiconductor substrate including the photoresist pattern formed through the lithography process (step 230).

According to the present invention, in the step of performing the first isotropic etching with respect to the etching layer, the first isotropic etching may be performed until 10% to 50% of the thickness of the etching layer is etched from the top surface of the etching layer making contact with the photoresist layer. If the first isotropic etching is performed by 10% or less of the thickness of the etching layer, and if the second isotropic etching is performed in the following process, undercut is caused in the lower portion of a passivation layer, so that a practical efficiency for the deposition of the passivation layer is degraded. In addition, if the first isotropic etching is performed until 50% or more of the thickness of the etching layer is etched, the undercut is remarkably advanced, so that it is impossible to realize the desired lead top width according to the present invention.

The passivation layer is deposited on the etching layer including the photoresist pattern (step 240).

After the first isotropic etching is performed, the passivation layer is deposited on the etching layer including the photoresist pattern. In this case, the passivation layer prevents an external shock from being delivered to the photoresist layer and the etched portion. In addition, the passivation layer prevents corrosion by shielding moisture and prevents the above undercut. The passivation layer is formed by coating the etching layer with an organic material through a deeping coating scheme, the present invention does not specially limit a scheme of depositing the passivation layer.

Preferably, the passivation layer may be deposited on a portion that has been subject to the first isotropic etching. Conventionally, when isotropic etching is performed, undercut is caused on the upper end portion of the etching layer making contact with the photoresist layer as the etching layer in the lower portion of the photoresist layer is etched. For this reason, the fine pattern of the etching layer has a sectional surface in the shape of a triangle or a trapezoid after isotropic etching is finally performed, so that there is a difficulty in ensuring the minimum width suitable for a lead. Accordingly, the passivation layer is deposited, so that the occurrence of undercut is prevented.

The passivation layer is removed corresponding to a portion that has been subject to the first isotropic etching (step 250).

A scheme for removing the passivation layer may be used as a scheme generally known in the art, and the present invention does not specially limit the scheme for removing the passivation layer. For example, generally, a normal etching scheme may be used to remove the passivation layer, a solvent for the normal etching scheme includes an iron chloride-based solvent, a copper chloride solvent or ammonia water, and a UV laser beam or a $CO_2$ laser beam may be used.

Preferably, in the step of removing the passivation layer corresponding to a portion that has been subject to the first isotropic etching, the width the portion may correspond to the width of a trench of a photoresist pattern. The passivation layer corresponding to the width of the trench is removed in parallel to the etching direction.

In addition, the step 250 of removing the passivation layer corresponding to a portion that has been subject to the first isotropic etching may be omitted according to process environment. In this case, after the passivation layer is deposited on the etching layer including the photoresist pattern (Step 240), the following second isotropic etching (step 260) may be performed.

The second isotropic etching is performed with respect to a predetermined portion having no passivation layer (step 260).

In other words, the second isotropic etching is performed with respect to a portion, which has been subject to the first isotropic etching and has no passivation layer, in direction vertical to the etched layer. The etching scheme of the second isotropic etching may be identical to that of the first isotropic etching, and the present invention does not specially limit the etching scheme.

Preferably, the semiconductor substrate includes a polyimide (PI) film. The PI film is recently used for a portable phone, a plasma display panel (PDP), and a liquid crystal display (LCD) as an original material of a flexible printed circuit board (PCB). If the PI film is coated with an electrodeposited copper foil, a flexible copper clad laminate (FCCL) is formed. Then, circuits are realized on the FCCL through processes including etching, so that a PCB is constructed. The etching layer includes one of a metal layer, an insulating layer, and a conductive layer.

Finally, after the second isotropic etching is performed, a desired fine pattern is formed through a stripping process to remove the photoresist pattern.

FIGS. 8 to 11 are views showing a method for forming a fine pattern according to an embodiment of the present invention.

Figure 8:
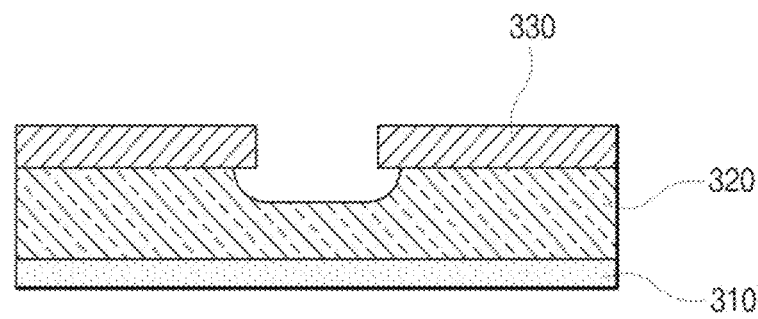
FIGS. 8 to 11 are views showing an isotropic etching process according to the present invention.

Referring to FIG. 8, after forming an etching layer 320 on a semiconductor substrate 310, a photoresist layer 330 is formed on the upper portion of the etching layer 320, and then the first isotropic etching is formed.

According to the present invention, in the step of performing the first isotropic etching with respect to the etching layer 320, the first isotropic etching may be performed until 10% to 50% of the thickness of the etching layer 320 is etched from the top surface of the etching layer 320 making contact with the photoresist layer 330. If the first isotropic etching is performed until 10% or less of the thickness of the etching layer is etched, undercut is caused in the lower portion of a passivation layer 340. If the first isotropic etching is performed until 50% or more of the thickness of the etching layer 320 is etched, the undercut is remarkably advanced through the first isotropic etching, so that it is difficult to realize the desired lead top width according to the present invention.

Figure 9:
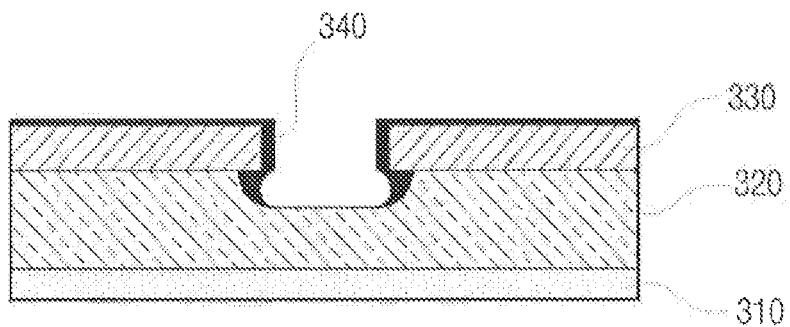

Referring to FIG. 9, after the first isotropic etching is performed, the passivation layer 340 is deposited on the etching layer 320 including the photoresist pattern 330. In this case, the passivation layer 340 prevents an external shock from being directly delivered to the photoresist layer and the etched portion. In addition, the passivation 340 prevents corrosion by shielding moisture and prevents the above undercut.

Preferably, the passivation layer 340 may be deposited on a portion that has been subject to the first isotropic etching.

Figure 10:
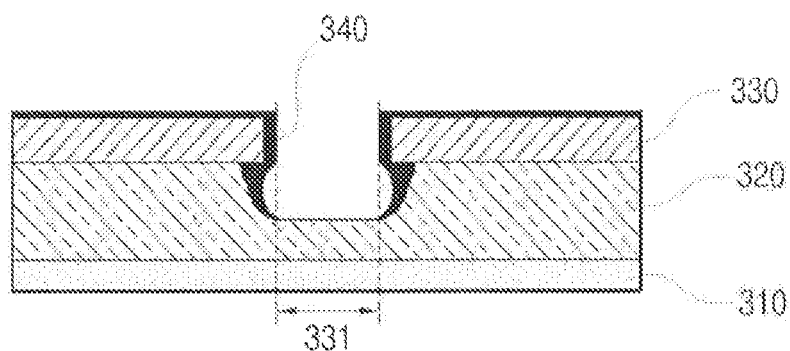

Referring to FIG. 10, after the passivation layer 340 is deposited, the passivation layer 340 is removed corresponding to a portion that has been subject to the first isotropic etching.

Preferably, in the step of removing the passivation layer corresponding to a predetermined portion that has been subject to the first isotropic etching, the predetermined portion may be a portion 331 corresponding to the width of a trench of the photoresist pattern 330. The passivation layer of the portion 331 is removed in parallel to an etching direction.

Figure 11:
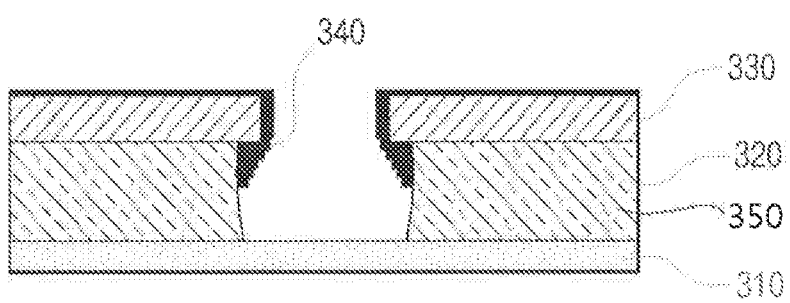

Referring to FIG. 11, the second isotropic etching is performed with respect to the etching layer 310 after the passivation layer 340 is removed corresponding to a predetermined portion that has been subject to the first isotropic etching. In other words, the second isotropic etching is performed with respect to a portion, which has been subject to the first isotropic etching and has no passivation layer, in a direction vertical to the etching layer. Therefore, according to the present invention, the first isotropic etching is performed with respect to an etching layer coated with a photoresist layer, a passivation layer is formed on a portion that has been subject to the first isotropic etching, and then the second isotropic etching is performed, thereby preventing undercut of the etching layer 310 in the lower portion of the photoresist provided with a pattern. Accordingly, it is possible to realize a fine pattern 350, which may be an internal lead 350, having the same shape as that of a fine pattern that is subject to anisotropic etching.

Figure 12:
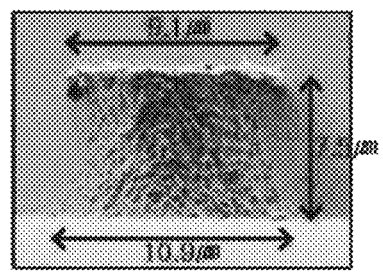
FIG. 12 is a photographic view showing the shape of a lead according to an embodiment of the present invention.
Figure 13:
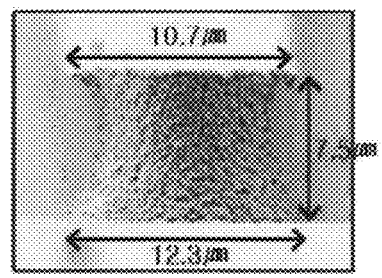
FIG. 13 is a photographic view showing the shape of a lead according to another embodiment of the present invention.

FIG. 12 is a photographic view showing the shape of a lead according to an embodiment of the present invention, and FIG. 13 is a photographic view showing the shape of a lead according to another embodiment of the present invention.

Figure 1:
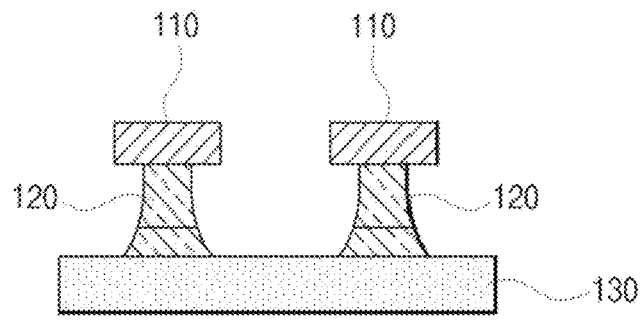
FIG. 1 is a view showing a pattern that is isotropically etched according to the related art.
Figure 2:
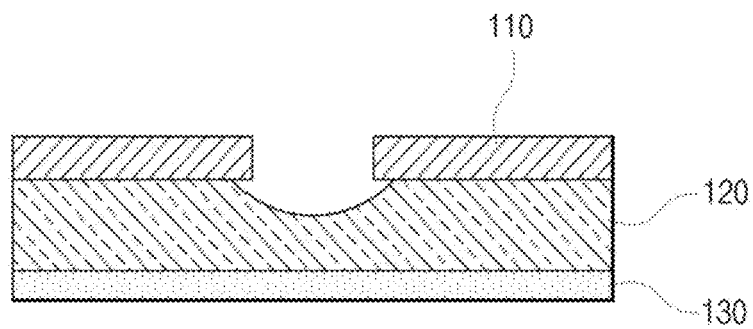
FIGS. 2 to 5 are views showing etched profiles through conventional isotropic over etching.
Figure 3:
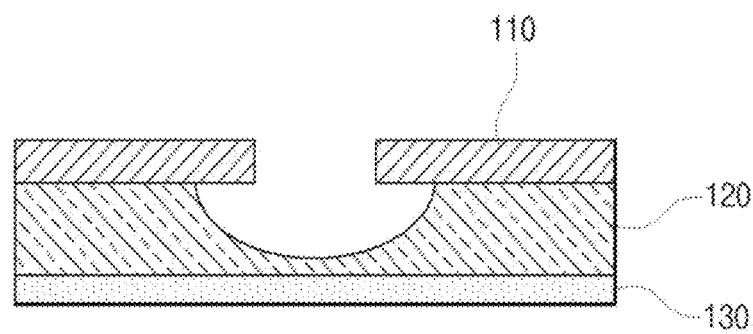
Figure 4:
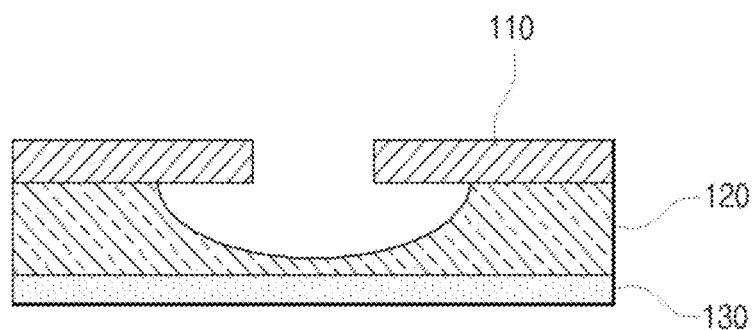
Figure 5:
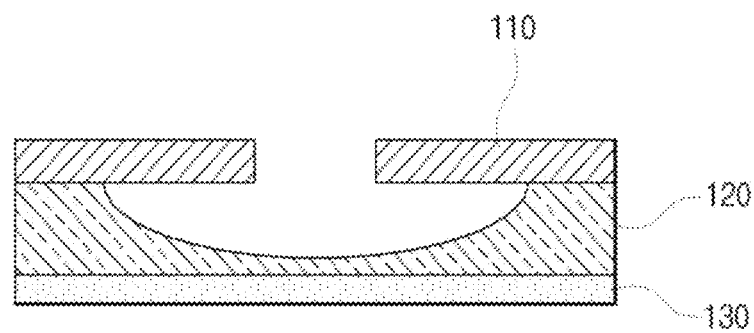
Figure 6:
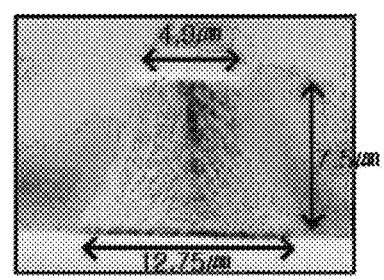
FIG. 6 is a photographic view showing the shape of a lead of a fine pattern employing isotropic etching according to the related art.

Referring to FIG. 12, if isotropic etching is performed under the same condition as that of FIG. 6 that the pitch width (not shown) of an internal lead in a chip-on film is 25 µm, and the height of the internal lead is 7.5 µm, the width of the lower portion of the internal lead becomes 10.9 µm, and the width of the upper portion of the internal lead becomes 9.1 µm. Accordingly, it can be recognized from FIG. 12 that a difference is rarely made between the widths of the upper portion and the lower portion of the internal lead. In addition, as compared with a case of FIG. 6, it can be recognized that the width of the upper portion of the internal lead according to the present invention is increased by 1.9 times under the condition of the same pitch and the same height.

Therefore, according to the present invention, a fine pattern that cannot be realized through typical anisotropic etching is formed even with the same pitch, so that the lead top width can be sufficiently ensured, thereby obtaining superior resolution and a focus margin.

Referring to FIG. 13, if isotropic etching according to the present invention is performed under a condition that the pitch width (not shown) of an internal lead in a chip-on film is 30 µm, and the height of the internal lead is 7.5 µm, the width of the lower portion of the internal lead becomes 12.3 µm, and the width of the upper portion of the internal lead becomes 10.7 µm. When comparing the result of FIG. 13 with the result of FIG. 12, it can be recognized that a difference is rarely made between the widths of the upper and lower portions of the internal lead even through the pitch width of the internal lead in the chip-on film is increased. This comparative result represents that isotropic etching according to the present invention is effective in the formation of a fine pattern.

In addition, the sectional area of the internal lead in the chip-on film shown in FIG. 6 is 66.19 µm$^2$, and the sectional area of the internal lead in the chip-on film shown in FIG. 12 is 75.00 µm$^2$. As a result, the sectional area of a pattern through the etching scheme according to the present invention becomes wider than the sectional area of a pattern through an etching scheme according to the related art, so that it is possible to more quickly dissipate heat emitted from a semiconductor integrated circuit because the lead has an expanded sectional area.

In detail, the present invention provides a method for forming a fine pattern using isotropic etching, in which isotropic etching is performed by depositing a protection material layer, thereby forming a fine pattern that cannot be realized through a typical isotropic etching scheme. Accordingly, a lead top width can be sufficiently ensured, thereby obtaining superior resolution and a focus margin. In addition, the shape of a lead is changed to have an increased sectional area so that heat emitted from a semiconductor integrated chip is more quickly dissipated and the lead can be easily bonded with the semiconductor integrated chip. Thus, superior resolution is obtained and a focus margin is ensured when the precise fine pattern is formed, so that the fine pattern is applicable for various industrial fields, such as a tape carrier package that is a substrate for a semiconductor integrated circuit, a chip-on film, and a flexible circuit substrate.

It will be apparent to those skilled in the art that various modifications and variations can be made in the present invention. Thus, it is intended that the present invention covers the modifications and variations of this invention provided they come within the scope of the appended claims and their equivalents.

The invention claimed is:

1. A semiconductor device, comprising:
   a substrate; and
   an internal lead formed on the substrate and having a fine pattern, wherein the internal lead includes an upper surface, a lower surface and a side surface connecting the upper surface to the lower surface, the side surface extending substantially continuously without a step from the upper surface to the lower surface,
   wherein a width of the internal lead gradually narrows from a lower width to an upper width such that the upper width is less than the lower width of the internal lead, and a ratio of the upper width/lower width is over 40%, and
   wherein the side surface of the internal lead has an upper portion and a lower portion, and the semiconductor device further comprises:
   a passivation layer formed directly on upper portion of the side surface of the internal lead and not directly on the lower portion of the side surface of the internal lead such that the passivation layer leaves the lower portion of the side surface of the internal lead exposed.

2. The semiconductor device according to claim 1, wherein the internal lead has a ratio of the upper width/lower width not less than 40% and not more than 90%.

3. The semiconductor device according to claim 1, wherein the side surface has a curved shape.

4. The semiconductor device according to claim 1, wherein the passivation layer is an organic layer.

5. The semiconductor device according to claim 1, wherein the fine pattern has a ratio of the upper width/lower width not less than 80%.

6. A semiconductor device, comprising:
   a substrate; and
   an internal lead having a fine pattern, the internal lead comprising an upper portion to which a first isotropic etching process has been applied and a lower portion to which a second isotropic etching process has been applied; and
   a passivation layer formed directly on the upper portion of the internal lead and not directly on the lower portion of the internal lead such that the passivation layer leaves the lower portion of the internal lead exposed,
   wherein a width of the internal lead gradually narrows from a lower width to an upper width such that the upper width is less than the lower width of the internal lead, and a ratio of the upper width to the lower width is over 40%.

7. The semiconductor device according to claim 6, wherein the passivation layer is an organic layer.

8. The semiconductor device according to claim 6, wherein the fine pattern has a ratio of the upper width/lower width not less than 80%.

9. The semiconductor device according to claim 6, wherein the internal lead includes an upper surface, a lower surface and a side surface connecting the upper surface to the lower surface, and the side surface extends substantially continuously without a step from the upper surface to the lower surface.

10. The semiconductor device according to claim 9, wherein the side surface has a curved shape.

* * * * *